United States Patent [19]

Wada et al.

[11] 4,144,096

[45] Mar. 13, 1979

[54] SOLAR BATTERY AND METHOD OF MANUFACTURE

[75] Inventors: Shinji Wada; Yoshiyuki Isobe, both of Suwa, Japan

[73] Assignee: Kabushiki Kaisha Suwa Seikosha, Tokyo, Japan

[21] Appl. No.: 864,289

[22] Filed: Dec. 27, 1977

[30] Foreign Application Priority Data

Dec. 27, 1976 [JP] Japan ............................... 51-158878
Jan. 26, 1977 [JP] Japan ............................... 52-7412

[51] Int. Cl.[2] ............................................ H01L 31/06

[52] U.S. Cl. .................................... 136/89 P; 29/572; 136/89 SJ; 357/30

[58] Field of Search .......................... 136/89 P, 89 SJ; 357/30; 29/572

[56] References Cited

U.S. PATENT DOCUMENTS

| | | | |
|---|---|---|---|
| 3,546,542 | 12/1970 | Riel et al. | 317/234 |
| 3,994,012 | 11/1976 | Warner, Jr. | 357/30 |

FOREIGN PATENT DOCUMENTS

| | | | |
|---|---|---|---|
| 1351454 | 5/1974 | United Kingdom | 29/572 |

OTHER PUBLICATIONS

A. I. Bennett et al., "An Integrated High-Voltage Solar Panel," *Conf. Record IEEE Photovoltaic Specialists Conf.*, Mar. 1967, pp. 148-159.

*Primary Examiner*—John H. Mack

*Attorney, Agent, or Firm*—Blum, Moscovitz, Friedman & Kaplan

[57] ABSTRACT

A monolithic solar battery including a plurality of P-N junction unit solar cells mounted on a substrate is provided. Each unit solar cell is isolated electrically from an adjacent cell by a buffer region of a material having a different conductivity than the substrate. An active photovoltaic layer formed on the light receiving surface of each solar cell between two buffer regions overlaps one of the two buffers defining each cell. Wiring for electrically connecting the unit solar cells in series fashion and electrodes are provided on the upper or lower surfaces of the substrate.

16 Claims, 10 Drawing Figures

SOLAR BATTERY AND METHOD OF MANUFACTURE

BACKGROUND OF THE INVENTION

This invention relates generally to a monolithic solar battery, and particularly to an improved monolithic solar battery including a plurality of P-N junction unit solar cells mounted on a substrate. Recently, solar batteries have been used as a power source for operating small electronic devices, such as electronic wristwatches and pocket calculators. These P-N junction solar batteries include a semiconductive substrate material, such as silicon or gallium arsenide. The voltage obtainable from these solar batteries is dependent upon the size of the band gap energy of the semiconductive material. For example, a silicon solar battery provides about 0.5 volts and a gallium arsenide solar battery provides about 0.9 volts.

An electronic wristwatch requires a voltage drop of about 2 volts and a portable electronic calculator requires about 4 volts for operation. Thus, when these solar batteries are used as power sources for such electronic devices, a plurality of solar batteries of this type must be connected in series. Conventionally, the connection was accomplished by methods such as wire bonding, face-down bonding, tape carrier, and the like. However, each of these methods has serious deficiencies, inasmuch as they involve complicated mountings, high cost of assembly and low reliability of the products. Accordingly, now that solar battery technology has improved and the batteries may be mass produced, it is desirable to provide an improved monolithic solar battery comprising a plurality of unit solar cells mounted on a substrate for use in small electronic devices, such as electronic wristwatches and portable electronic calculators.

SUMMARY OF THE INVENTION

Generally speaking, in accordance with the invention, a monolithic solar battery suitable for use in a small electronic device, such as an electronic wristwatch and a portable electronic calculator is provided. The solar battery comprises a plurality of P-N junction unit solar cells mounted on a semiconductor substrate. Each unit solar cell is defined by two buffer regions in the substrate formed of a material having a conductivity different than the substrate, the buffer regions electrically isolating each unit solar cell. An active photovoltaic layer on the upper light receiving surface of each unit solar cell overlaps and is connected electrically with one of the two buffer regions defining the cell. Wiring for electrically connecting adjacent cells in series fashion and the battery electrodes are provided on the upper or lower surfaces of the substrate.

The solar battery including a plurality of P-N junction unit solar cells is manufactured by forming a thin $SiO_2$ layer on both the upper and lower surfaces of a semiconductive substrate, selectively removing opposed portions of the $SiO_2$ layers from both surfaces by photo-etching; forming a plurality of spaced buffer regions through the substrate for electrically isolating the cells; selectively removing $SiO_2$ from the light receiving surface and forming a photovoltaic region in each cell of material having the same conductivity as the buffer regions and overlapping a buffer region of each cell; forming an $SiO_2$ layer over the photovoltaic region and buffer region; selectively removing the $SiO_2$ layer; and forming metal electrical contacts for electrically connecting adjacent cells in series fashion and the battery electrodes.

Accordingly, it is an object of the invention to provide an improved solar battery.

Another object of the invention is to provide an improved solar battery including a plurality of P-N junction unit solar cells.

A further object of the invention is to provide an improved solar battery including a plurality of P-N junction unit solar cells formed on a single substrate.

Still another object of the invention is to provide an improved solar battery including a plurality of P-N junction unit solar cells wherein each cell is electrically isolated by a buffer region formed through the substrate.

Still a further object of the invention is to provide an improved solar battery including a plurality of P-N junction unit solar cells wherein a photovoltaic region is formed in electrical contact with a buffer region defining the cells.

Another object of the invention is to provide an improved method for manufacturing a solar battery including a plurality of P-N junction unit solar cells.

Still other objects and advantages of the invention will in part be obvious and will in part be apparent from the specification.

The invention accordingly comprises several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

FIGS. **1*a–e* are cross-sectional views illustrating the sequence of steps for preparing a monolithic solar battery constructed in accordance with the invention.

DESCRIPTION OF THE PREFERRED EMBODIMENTS

Referring now to FIGS. **1*a*–1*e*, the sequence of steps for preparing a monolithic solar battery wherein wiring between unit solar cells of the battery and battery electrodes are provided on the upper light receiving surface of the solar battery constructed in accordance with one embodiment of the invention is illustrated. An N-type semiconductive substrate 1 formed from a single silicon crystal of from 100 to 150 μm in thickness is shown. A thin layer of $SiO_2$ 2 is formed across the upper and lower surfaces of substrate 1 by wet oxidation. $SiO_2$ layer 2 is selectively removed from opposed regions of both upper and lower surfaces of substrate 1 by photo-etching for defining a plurality of spaced opposed regions 7** for formation of buffer regions between each unit solar cell.

Referring specifically to FIG. **1*b*, P-type dopant material is diffused into substrate 1 from both upper and lower surfaces of substrate 1 for forming a plurality of spaced lightly doped $P^-$ buffer regions 3**. When $P^-$ buffer regions 3 are formed by diffusion from both surfaces of substrate 1 in this manner, the time required for diffusion can be reduced by one-half compared to conventional diffusion from one surface. Diffusion is accomplished by heating substrate 1 to about 1100° C. for half an hour, lightly etching the surfaces and applying P-type material in a nitrogen atmosphere containing 10 percent oxygen at 1200° C. until the P-type material is diffused through substrate 1 to form $P^-$ buffer regions 3.

Figure 1A:
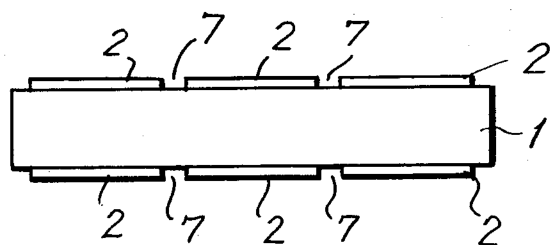
Figure 1B:
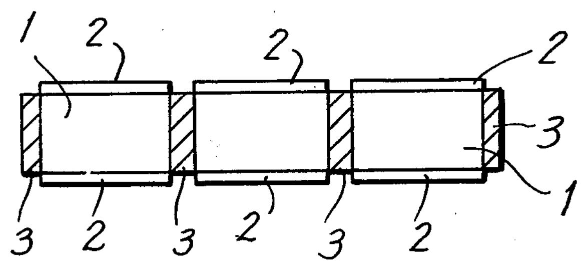
Figure 1C:
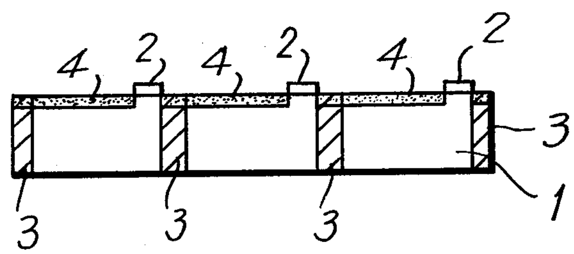

Referring now to FIG. 1*c*, selective portions of $SiO_2$ layers 2 between $P^-$ buffer regions 3 are removed by photo-etching for preparing the upper light receiving surface of substrate 1 for forming an active heavily doped $P^+$ photovoltaic region 4 thereon. $P^+$ photovoltaic regions 4 are formed by diffusion of P-type material into substrate 1 in the same manner as described with respect to formation of $P^-$ diffusion buffers 3, but at a higher dopant concentration, to form a plurality of $P^+$ photovoltaic regions 4. P-type material of $P^+$ photovoltaic region 4 in each unit cell is diffused to a depth of about 2 μm across the upper surface of substrate 1 between adjacent $P^-$ buffer regions 3 which have been etched free of $SiO_2$ layers 2 and across the upper portion of one $P^-$ buffer region 3 defining a unit cell. Thus, $P^+$ photovoltaic regions 4 and $P^-$ buffer regions 3 in each unit solar cell overlap along the upper surface of substrate 1 and are electrically connected.

Figure 1D:
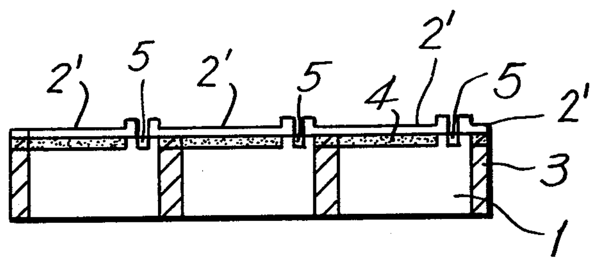

As shown in FIG. 1*d*, a thin layer of $SiO_2$ 2′ is formed across the top surface of substrate 1 by wet oxidation overlapping $P^-$ buffer regions 3 and $P^+$ photovoltaic regions 4. $SiO_2$ layer 2′ overlapping the region free of P-type material on the upper surface of substrate 1 is photo-etched to expose substrate 1 for diffusion of N-type material to form a heavily doped $N^+$ diffusion region 5 in each unit solar cell. $N^+$ diffusion regions 5 are diffused into substrate 1 to about the same depth as $P^+$ photovoltaic region 4 in the upper surface of substrate 1 in the region free of P-type material.

Figure 1E:
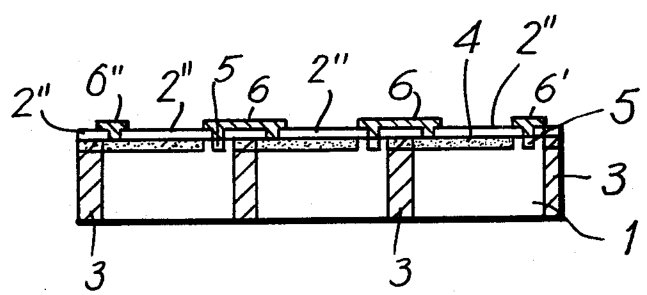

Referring now to FIG. 1*e*, the entire upper surface of substrate 1 is etched with hydrofluoric acid to remove $SiO_2$ layer 2′ and a new thin layer of $SiO_2$ 2″ of about 1500A is formed across the top surface by wet oxidation. $SiO_2$ layer 2″ is selectively contact photo-etched thereby removing $SiO_2$ layer 2″ from the region overlapping each $N^+$ diffusion region 5 and a portion of each $P^+$ photovoltaic region 4. A thin layer of aluminum is deposited across the entire top surface and the unneeded portions of aluminum are removed by photo-etching for forming a metal electrical contact for connecting adjacent unit solar cells in series fashion. Battery-output electrode 6′ at $N^+$ diffusion region 5 of one end unit solar cell and output electrode 6″ at $P^+$ photovoltaic region 4 of the unit solar cell at the other end of substrate 1 are provided for electrically connecting the solar battery to an electronic device.

Referring now to FIGS. 2*a*–2*e*, the sequence of steps for preparing a solar battery including a plurality of P-N junction unit solar cells wherein the electrical connection between unit solar cells of the battery and electrodes are provided on the surface opposed to the light receiving surface of the solar battery in accordance with a second embodiment of the invention is illustrated. An N-type semiconductive substrate 1 formed from a single silicon crystal of from 100 to 150 μm in thickness is shown. A thin layer of $SiO_2$ is formed across both the upper and lower surfaces of substrate 1 by wet oxidation. $SiO_2$ layer 12 is selectively removed from opposed regions of both upper and lower surfaces of substrate 1 by photo-etching for defining a plurality of opposed spaced regions 17 thus defining each unit solar cell. P-type dopant material for electrically isolating each unit solar cell is diffused through substrate 1 for forming lightly doped $P^-$ buffer regions 13 in the same manner as described for the embodiment of the invention illustrated in FIGS. 1*a*–1*e*.

Figure 2A:
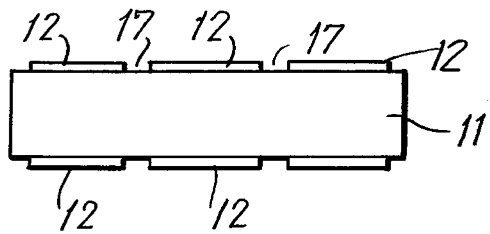
FIGS. 2*a–e*** are cross-sectional views illustrating the sequence of steps for preparing a monolithic solar battery constructed in accordance with another embodiment of the invention.
Figure 2B:
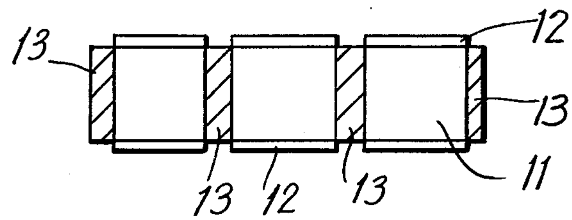
Figure 2C:
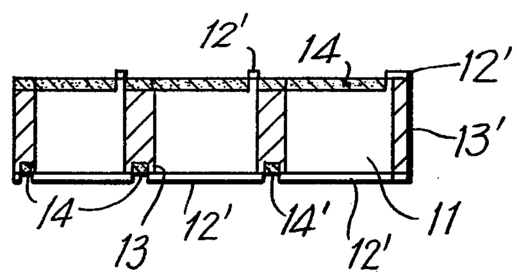

Referring now to FIG. 2*c*, remaining $SiO_2$ layers 12 are removed from both upper and lower surfaces of substrate 11 and new thin layers of $SiO_2$ 12′ are formed on both upper and lower surfaces of substrate 11 by wet oxidation. Selective portions of $SiO_2$ layer 12′ are removed by photo-etching, leaving $SiO_2$ thin layers 12′ over at least portions of the upper surface of substrate 11 between $P^-$ buffer regions 13 and along the bottom surfaces of substrate 11 in the regions between and overlapping $P^-$ buffer regions 13 for exposing a portion of each diffusion buffer 13, except buffer 13′ at one end of substrate 11. P-type material is diffused into both upper and lower surfaces of substrate 1 free of $SiO_2$ layer 12′ for forming a heavily doped $P^+$ photovoltaic region 14 about 2 μm in depth on the upper light receiving surface of substrate 11 in each unit cell and $P^+$ diffusion regions 14′ in buffer regions 13 on the bottom surface of substrate 11.

Figure 2D:
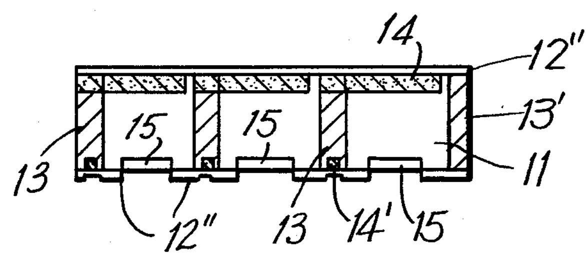

Referring now to FIG. 2*d*, $SiO_2$ layers 12′ are removed by etching and a new thin layer of $SiO_2$ 12″ is formed across both upper and lower surfaces of substrate 11 by wet oxidation. $SiO_2$ layer 12″ on the lower surface of substrate 11 is selectively removed by photo-etching from a portion of the region intermediate buffer regions 13 and N-type material is diffused into substrate 11 forming a heavily doped $N^+$ diffusion region 15 in each unit solar cell.

Figure 2E:
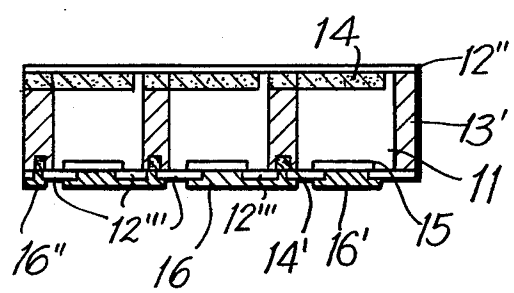

Referring now to FIG. 2*e*, both the upper and lower surfaces of substrate 11 are etched with hydrofluoric acid to remove $SiO_2$ layers 12″ and a new thin layer of $SiO_2$ 12‴ of about 1500A in thickness is formed by wet oxidation across both surfaces. Selective portions of $SiO_2$ layer 12‴ are removed from the bottom surface of substrate 11 by contact photo-etching in the region between diffusion buffers 13 overlapping a portion of $N^+$ diffusion regions 15 and a portion of $P^+$ diffusion region 14′ in $P^-$ buffer region 13. Aluminum is deposited along the entire bottom surface of substrate 11 and is selectively removed by photo-etching; thereby forming metal electrical contacts 16 between adjacent unit solar cells in series fashion and a battery output electrode 16′ at one $N^+$ diffusion region 15 of one end unit solar cell and a second battery output electrode 16″ at $P^-$ buffer region 13 at the other end of substrate 11.

A solar battery constructed and arranged in accordance with this embodiment of the invention provides an effective photovoltaic region of about 20 percent more surface area than a solar battery having metal contacts and electrodes formed on the light receiving surface thereof, thereby providing more photoelectric current. Additionally, a solar battery constructed and arranged in accordance with this embodiment of the invention permits a smaller solar battery to be manufactured for use in small electronic devices. The surface area necessary for providing electrical contact between the unit solar cells and the battery output electrodes does not occupy any of the light receiving surfaces of the photovoltaic regions of the solar battery. Accordingly, a substantial benefit is obtained by the opposing metal electrical contacts between the unit solar cells and the battery electrodes along the surface opposed to the light receiving surface of the substrate.

It is possible to vary the construction in accordance with this embodiment of the invention by providing metal electrical contacts between unit solar cells on the light receiving surface and forming the lead-out electrodes on the opposed surface thereof. Similarly, metal electrical contacts between unit solar cells may be provided on the opposed surface and the lead-out electrodes may be provided on the light receiving surface of the solar battery.

Both embodiments of the invention described above utilize P-N junction unit solar cells including an N-type semiconductive material as the substrate. The objects of the invention can be gained even in a N-P junction solar battery utilizing a p-type semiconductive material as the substrate. Moreover, while these embodiments have been described with respect to a silicon substrate for the solar battery, the concept of the invention can be applied equally to a homojunction solar battery using GaAs, GaP, or the like. In addition, the invention can be applied to such heterojunction solar batteries including GaAsGaAlAs, Si-$SnO_2$, and the like, or to a Schottky Barrier solar battery including a semiconductive material and a metal material substrate.

Accordingly, by constructing and arranging a solar battery in accordance with the invention, a monolithic solar battery including a plurality of unit solar cells wherein each unit solar cell is electrically isolated by buffer regions and an active photovoltaic diffusion region in each unit solar cell is electrically connected with one of the two buffer regions defining the cell provides an improved solar battery. Additionally, metal electrical contacts for connecting unit solar cells in series fashion and lead-out electrodes may be provided on either the upper or lower surface of the substrate, and the metal electrical contact and the lead-out electrodes may be provided on either one of the upper or lower surfaces of the substrate. When electrical connection between the unit cells of the solar battery and lead-out electrodes are provided on the lower surface of the substrate, a substantial increase in the active photovoltaic area is obtained, permitting an increased electrical output of the solar battery having a fixed surface area.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A solar battery including a plurality of P-N junction unit solar cells comprising:

a semiconductive substrate of given conductivity type having a light receiving surface and an opposed surface;

a plurality of spaced, lightly doped buffer regions in said substrate for defining and electrically isolating said unit solar cells, said buffer regions formed from a material having a conductivity opposite from said substrate;

a photovoltaic region in each said unit solar cell across a portion of said light receiving surface of each said unit solar cell and overlapping one of said buffer regions defining said unit solar cell for electrical contact therewith, said photovoltaic region formed from a material having the same conductivity type but higher dopant concentration than said buffer regions; and metal electrical contacts disposed on a surface of said substrate for electrically connecting said unit solar cells in series fashion.

2. The solar battery of claim 1, wherein said spaced buffer regions and said photovoltaic regions are formed by diffusion of dopant material into said substrate.

3. The solar battery of claim 1, wherein said spaced buffer regions are formed by diffusion of dopant material into said substrate from both said light receiving and opposed surfaces of said substrate.

4. The solar battery of claim 1, wherein said metal electrical contacts are formed on a portion of said light receiving surface of said substrate.

5. The solar battery of claim 1, wherein said metal electrical contacts are formed on said opposed surface of said substrate.

6. The solar battery of claim 1, wherein said substrate is formed from an N-type semiconductive material.

7. The solar battery of claim 6, wherein said semiconductive material is a single silicon crystal.

8. The solar battery of claim 7, wherein said buffer regions and said photovoltaic regions are formed by diffusion of a P-type material into said substrate, and including a region of $N^+$-type material on the light receiving surface of said substrate in the region free of P-type material, a layer of $SiO_2$ selectively disposed on the light receiving surface for electrically isolating said P-type and said $N^+$-type regions, and said metal electrical contacts disposed between said regions of $N^+$-type material of one of said unit solar cells and a $P^+$-type photovoltaic region of another unit solar cell.

9. The solar battery of claim 8, wherein said metal electrical contacts are disposed for providing electrical contact between adjacent unit solar cells.

10. The solar battery of claim 7, including a region of $N^+$-type material in said substrate on the opposed surface of said substrate in the region between said spaced buffer regions, a layer of $SiO_2$ disposed on the light receiving surface of said substrate, a layer of $SiO_2$ disposed on the opposed surface of said substrate for electrically isolating said buffer regions from said $N^+$-type regions, and said metal electrical contacts disposed on said opposed surface of said substrate connecting said region of $N^+$-type material in one unit solar cell and said buffer region of another unit solar cell.

11. The solar battery of claim 10, including a region of higher dopant concentration in each said buffer region on the opposed surface of said substrate for electrically connecting each said buffer region to said metal electrical contacts.

12. The solar battery of claim 11, wherein said metal electrical contacts are disposed on the opposed surface of said substrate for electrically connecting adjacent unit solar cells.

13. A method of forming a solar battery including a plurality of P-N junction unit solar cells on a substrate formed from a semiconductive material comprising:

forming a plurality of spaced, lightly doped buffer regions of a material having a conductivity type opposed that of said substrate for defining said unit solar cells;

forming a photovoltaic region in each unit solar cell on a portion of the light receiving surface of said substrate, said photovoltaic region being of a material having the same conductivity as said buffer regions but higher dopant concentration and overlapping one of said buffer regions defining said unit solar cell for electrical contact between said photovoltaic region and said buffer region; and forming metal electrical contacts between said unit solar cells for electrically connecting said unit solar cells in series fashion.

14. The method of claim 13, wherein said buffer regions and said photovoltaic regions are formed by diffusion of dopant material into said substrate.

15. The method of claim 14, wherein said buffer regions are formed by diffusion through said substrate from both the light receiving surface of said substrate and the surface opposite thereto.

16. The method of claim 15, including forming masks of $SiO_2$ layers on both surfaces of said substrate by wet oxidation and etching selective portions for preparing the surfaces of said substrate for diffusion.

* * * * *